(12) United States Patent
Chen et al.

(10) Patent No.: US 8,519,801 B2
(45) Date of Patent: Aug. 27, 2013

(54) DIGITALLY CONTROLLED OSCILLATOR

(75) Inventors: Yen-Horng Chen, Taipei (TW); Wen-Chang Lee, Taipei (TW); Augusto Marques, Moscavide (PT); Xiaochuan Guo, Austin, TX (US)

(73) Assignee: Mediatek Singapore Pte. Ltd., Singapore (SG)

( * ) Notice: Subject to any disclaimer, the term of this patent is extended or adjusted under 35 U.S.C. 154(b) by 4 days.

(21) Appl. No.: 13/210,280

(22) Filed: Aug. 15, 2011

(65) Prior Publication Data

US 2013/0043958 A1 Feb. 21, 2013

(51) Int. Cl.
*H03B 5/12* (2006.01)

(52) U.S. Cl.
USPC .................. 331/117 FE; 331/36 C; 331/179

(58) Field of Classification Search
USPC ........... 331/36 C, 117 FE, 117 R, 167, 177 V, 331/179
See application file for complete search history.

(56) References Cited

U.S. PATENT DOCUMENTS

| | | | |
|---|---|---|---|
| 5,463,285 A * | 10/1995 | El-Hamamsy | 315/248 |
| 6,181,218 B1 | 1/2001 | Clark et al. | |
| 6,226,506 B1 | 5/2001 | Welland et al. | |
| 6,621,365 B1 | 9/2003 | Hallivuori et al. | |
| 6,658,748 B1 | 12/2003 | Leipold et al. | |
| 6,791,425 B2 | 9/2004 | Kitamura | |
| 7,212,073 B2 | 5/2007 | Youssoufian et al. | |
| 7,230,503 B1 * | 6/2007 | Huang | 331/117 R |
| 7,230,504 B1 * | 6/2007 | Marques et al. | 331/117 FE |
| 7,280,001 B2 * | 10/2007 | Maligeorgos et al. | 331/158 |
| 7,336,134 B1 * | 2/2008 | Janesch et al. | 331/36 C |
| 7,696,830 B2 | 4/2010 | Ohara et al. | |
| 7,764,127 B2 | 7/2010 | Sun et al. | |
| 8,134,414 B2 * | 3/2012 | McCorquodale et al. | 331/36 R |
| 2004/0077327 A1 * | 4/2004 | Lim et al. | 455/318 |
| 2008/0278249 A1 * | 11/2008 | Hyvonen | 331/117 R |

* cited by examiner

*Primary Examiner* — Levi Gannon
(74) *Attorney, Agent, or Firm* — McClure, Qualey & Rodack, LLP

(57) ABSTRACT

A digitally controlled oscillator is provided. The digitally controlled oscillator includes a pair of transistors cross-coupled to each other, a switched capacitor array coupled to the pair of transistors and a plurality of frequency tracking units coupled to the pair of transistors. The pair of transistors provides an output signal. The switched capacitor array tunes a frequency of the output signal. The frequency tracking units tune the frequency of the output signal to a target frequency. At least one of the frequency tracking units is capable of selectively providing a first capacitance and a second capacitance. A tuning resolution of the frequency tracking unit is determined by a difference between the first and second capacitances.

12 Claims, 6 Drawing Sheets

DIGITALLY CONTROLLED OSCILLATOR

BACKGROUND OF THE INVENTION

1. Field of the Invention

The invention relates to an oscillator, and more particularly to a digitally controlled oscillator.

2. Description of the Related Art

Generally, a digitally controlled oscillator (DCO) has a relatively wide tuning range in order to execute phase locked loop (PLL), voltage controlled oscillator (VCO) or other circuit digital automatic frequency calibration. In a DCO, the oscillating frequency is adjusted by controlling a plurality of digitally controlled frequency tracking units. In order to provide finer tuning resolutions and wider tuning ranges, a large number of frequency tracking units are needed for the oscillating frequency adjustment.

In a PLL, the DCO will contribute extra quantization noise as the frequency tracking units have finite tuning resolutions. In some improved circuits, the extra quantization noise can be noise shaped by a delta-sigma (4E) modulator, to meet phase noise (PN) requirements. However, the frequency tracking units may increase design complexity and reversely affect the operation frequency of the delta-sigma modulator.

Nevertheless, when the amount of frequency tracking units increases, the performance of the DCO is affected by the mismatches among the capacitors of the frequency tracking units. For example, the mismatch will degrade the phase error, the error vector magnitude (EVM) and the output RF spectrum (ORFS) performances of a direct frequency modulation transmitter using such a DCO implementing a large number of the frequency tracking units. Furthermore, a larger parasitic capacitor will narrow the total tuning range of the oscillating frequency the DCO can provide.

Accordingly, it is difficult to implement a DCO with a fine resolution.

BRIEF SUMMARY OF THE INVENTION

Digitally controlled oscillators are provided. An embodiment of a digitally controlled oscillator is provided. The digitally controlled oscillator comprises: a pair of transistors cross-coupled to each other for generating an output signal; a switched capacitor array coupled to the pair of transistors, for tuning a frequency of the output signal; and a plurality of frequency tracking units coupled to the pair of transistors, for tuning the frequency of the output signal to a target frequency. At least one of the frequency tracking units is capable of selectively providing a first capacitance and a second capacitance, and a tuning resolution of the frequency tracking unit is determined by a difference between the first and second capacitances.

Furthermore, another embodiment of a digitally controlled oscillator is provided. The digitally controlled oscillator comprises an amplifier with a negative resistance, having a first input terminal, a second input terminal and an output terminal for providing an output signal; and an LC circuit coupled to the first and second input terminals of the amplifier. The LC circuit comprises an inductor coupled between the first and second input terminals of the amplifier; and a plurality of frequency tracking units coupled to the inductor in parallel, each for providing a first capacitance or a second capacitance according to a control signal, so as to finely tune a frequency of the output signal. A tuning resolution of the frequency tracking unit is determined according to a difference between the first and second capacitances.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
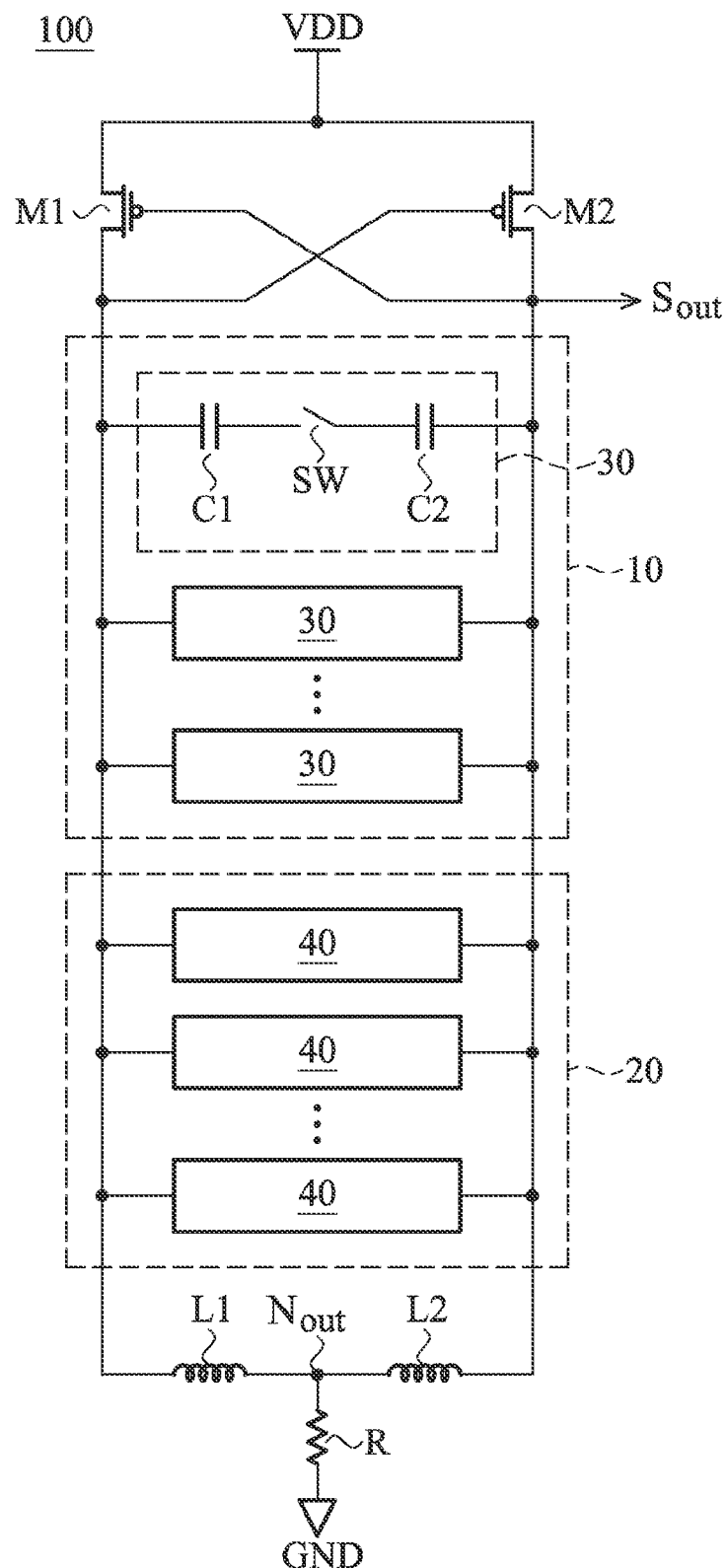
FIG. 1 shows a digitally controlled oscillator according to an embodiment of the invention.

FIG. 1 shows a digitally controlled oscillator (DCO) 100 according to an embodiment of the invention. The digitally controlled oscillator 100 comprises the transistors M1 and M2, a switched capacitor array 10, a frequency tracking array 20, two inductors L1 and L2 and a resistor R. The transistors M1 and M2 are cross-coupled to each other. The switched capacitor array 10 is coupled to the drains of the transistors M1 and M2, and the frequency tracking array 20 is coupled to the switched capacitor array 10 in parallel. The inductor L1 is coupled between a common node $N_{com}$ and the drain of the transistor M1, and the inductor L2 is coupled between the common node $N_{com}$ and the drain of the transistor M2. The resistor R is coupled between the common node $N_{com}$ and a ground GND.

In FIG. 1, the switched capacitor array 10 comprises a plurality of switched capacitor units 30 coupled in parallel. Each switched capacitor unit 30 comprises a capacitor C1 coupled to the drain of the transistor M1, a capacitor C2 coupled to the drain of the transistor M2 and a switch SW coupled between the capacitors C1 and C2, wherein the switch SW is controlled by an individual control signal. By switching the switches SW of the switched capacitor array 10, an output frequency of a signal $S_{out}$ can be tuned coarsely. The switched capacitor unit 30 is used as an example for description, and does not limit the invention. Furthermore, the frequency tracking array 20 comprises a plurality of frequency tracking units 40 coupled in parallel, which is used to finely tune the output frequency of the signal $S_{out}$ to a target frequency. In the frequency tracking array 20, each frequency tracking unit 40 is controlled by an individual control signal that controls the frequency tracking unit 40 to provide a first capacitance or a second capacitance. In the embodiment, the first capacitances of the frequency tracking units 40 are the same, and the second capacitances of the frequency tracking units 40 are the same.

Figure 2:
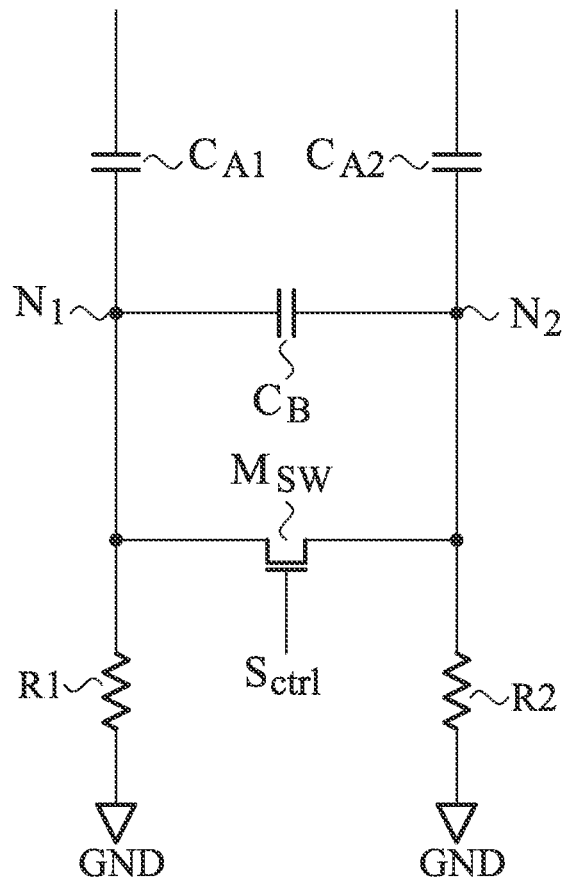
FIG. 2 shows a schematic illustrating the frequency tracking unit of FIG. 1 according to an embodiment of the invention.

FIG. 2 shows a schematic illustrating the frequency tracking unit 40 of FIG. 1 according to an embodiment of the invention. The frequency tracking unit 40 comprises three capacitors $C_{A1}$, $C_{A2}$ and $C_B$, two resistors R1 and R2 and a switch $M_{SW}$. Referring to FIG. 1 and FIG. 2 together, the capacitor $C_{A1}$ is coupled between the drain of the transistor M1 and a node $N_1$, and the capacitor $C_{A2}$ is coupled between the drain of the transistor M2 and a node $N_2$, wherein the capacitors $C_{A1}$ and $C_{A2}$ have the same capacitances. The capacitor $C_B$ is coupled between the nodes $N_1$ and $N_2$. The resistor R1 is coupled between the node $N_1$ and the ground GND, and the resistor R2 is coupled between the node $N_2$ and the ground GND. The switch $M_{SW}$ is coupled to the capacitor $C_B$ in parallel, which is controlled by an individual control signal $S_{ctrl}$. When the switch $M_{SW}$ is turned on by the control signal $S_{ctrl}$, the frequency tracking unit 40 provides an equivalent capacitance $C_{ON}$ according to the capacitors $C_{A1}$ and $C_{A2}$. When the switch $M_{SW}$ is turned off by the control signal $_{ctrl}$, the frequency tracking unit 40 provides an equivalent capacitance $C_{OFF}$ according to the capacitors $C_{A1}$, $C_{A2}$ and $C_B$. The equivalent capacitances $C_{ON}$ and $C_{OFF}$ are obtained by the following equations:

$$C_{ON} = \frac{C_A}{2} = C_{AD}$$

$$C_{OFF} = \frac{\frac{C_A}{2} \cdot C_B}{\frac{C_A}{2} + C_B} = \frac{C_{AD} \cdot C_B}{C_{AD} + C_B}.$$

Therefore, a unit capacitance $C_{step}$ is obtained according to a difference between the capacitances $C_{ON}$ and $C_{OFF}$, wherein $C_{step}$ is obtained by the following equation:

$$C_{step} = C_{ON} - C_{OFF} = \frac{C_{AD}^2}{C_{AD} + C_B}$$

$$= \frac{C_{AD}^2}{C_B}, \quad \text{if } C_{AD} << C_B.$$

In the embodiment, the unit capacitance $C_{step}$ is used as a tuning resolution of the frequency tracking unit 40 for turning the output frequency of the signal $S_{out}$ to a target frequency. Note that the three capacitors $C_{A1}$, $C_{A2}$ and $C_B$, are passive metal capacitors which are insensitive to noise and voltage swings. Furthermore, low fixed parasitical capacitances are obtained and layout structure of the frequency tracking unit 40 is easily matched for the capacitors $C_{A1}$, $C_{A2}$ and $C_B$. For example, the mismatching of the frequency tracking unit 40 is obtained by the following equation:

$$\frac{\Delta C_{step}}{C_{step}} = 2\frac{\Delta C_{AD}}{C_{AD}} - \frac{\Delta C_B}{C_B}.$$

Therefore, the gain factor $K_{DCO}$ of the digitally controlled oscillator 100 of FIG. 1 is obtained by the following equation:

$$K_{DCO} = \frac{C_{step}}{2 \cdot C_{tank}} \cdot f_{DCO},$$

where $f_{DCO}$ represents the output frequency of the signal $S_{out}$, i.e.

$$f_{DCO} = \frac{1}{2\pi \cdot \sqrt{LC_{tank}}},$$

wherein $C_{tank}$ and L represent the tank capacitance and inductance, respectively. In one embodiment, each of the capacitors $C_{A1}$, $C_{A2}$ and $C_B$ may be formed by a plurality of capacitors connected in series, parallel or combinations thereof.

Figure 3:
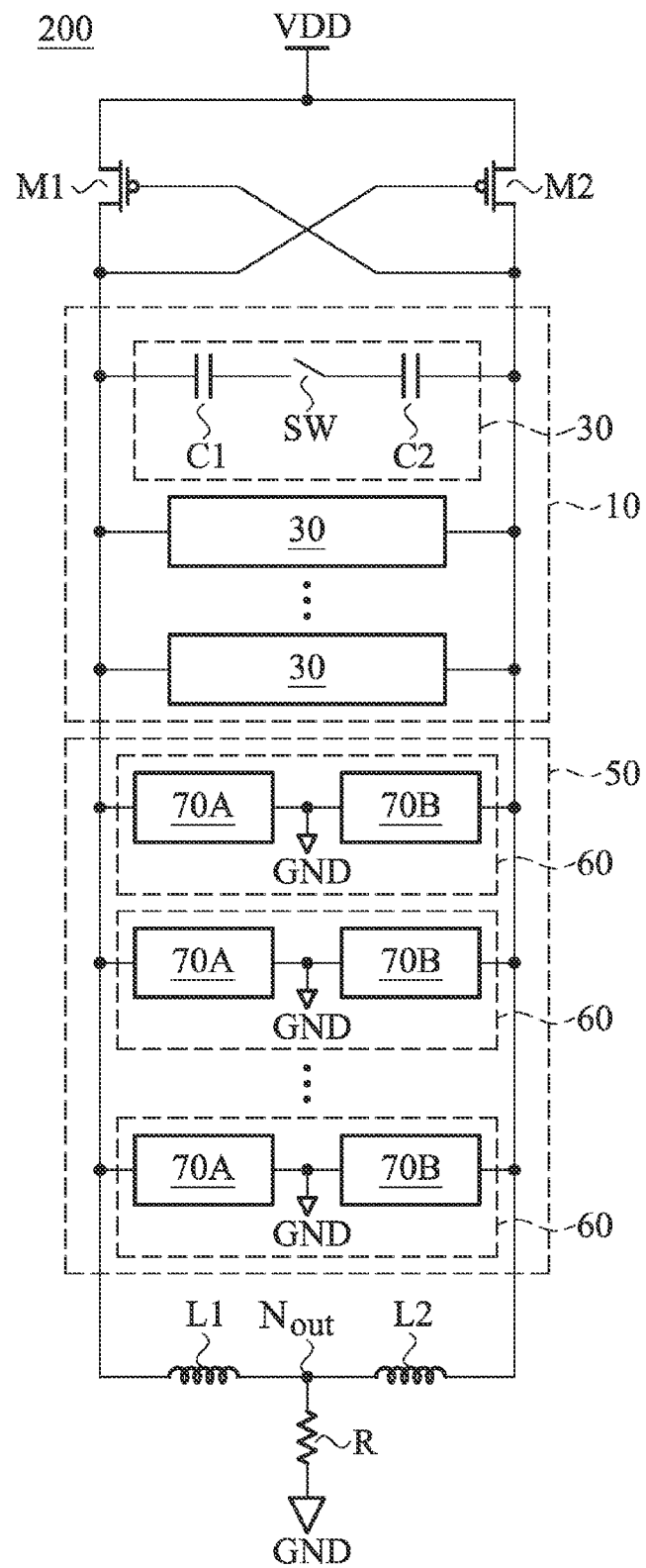
FIG. 3 shows a digitally controlled oscillator according to another embodiment of the invention.

FIG. 3 shows a digitally controlled oscillator 200 according to another embodiment of the invention. Compared with the digitally controlled oscillator 100 of FIG. 1, a frequency tracking array 50 of the digitally controlled oscillator 200 comprises a plurality of frequency tracking units 60 coupled in parallel, wherein each frequency tracking unit 60 comprises a sub-unit 70A coupled between the drain of the transistor M1 and the ground GND and a sub-unit 70B coupled between the drain of the transistor M2 and the ground GND, wherein the sub-units 70A and 70B have the same circuit structures. Similarly, each frequency tracking unit 60 is controlled by an individual control signal, i.e. the sub-units 70A and 70B of the frequency tracking unit 60 are controlled by the same control signal, wherein the individual control signal controls the sub-units 70A and 70B to provide a first capacitance or a second capacitance simultaneously. In the embodiment, the first capacitances of the sub-units 70A and 70B of each frequency tracking unit 60 are the same, and the second capacitances of the sub-units 70A and 70B of each frequency tracking units 60 are the same.

Figure 4:
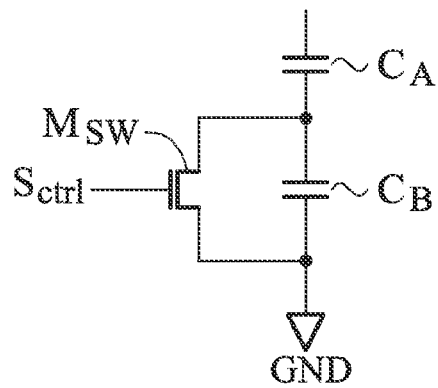
FIG. 4 shows a schematic illustrating the sub-unit of a frequency tracking unit of FIG. 3 according to an embodiment of the invention.

FIG. 4 shows a schematic illustrating the sub-unit 70A/70B of FIG. 3 according to an embodiment of the invention. Referring to FIG. 3 and FIG. 4 together, a capacitor $C_A$ is coupled to the drain of a corresponding transistor. For example, the capacitor $C_A$ of the sub-unit 70A is coupled to the drain of the transistor M1, and the capacitor $C_A$ of the sub-unit 70B is coupled to the drain of the transistor M2. Furthermore, a capacitor $C_B$ is coupled between the capacitor $C_A$ and the ground GND, and a switch $M_{SW}$ is coupled to the capacitor $C_B$ in parallel, wherein the switch $M_{SW}$ is controlled by an individual control signal $S_{ctrl}$. When the switch $M_{SW}$ is turned on by the control signal $S_{ctrl}$, the sub-unit 70A/70B provides an equivalent capacitance $C_{ON1}$ according to the capacitor $C_A$. When the switch $M_{SW}$ is turned off by the control signal $S_{ctrl}$, the sub-unit 70A/70B provides an equivalent capacitance $C_{OFF1}$ according to the capacitors $C_A$ and $C_B$. The equivalent capacitances $C_{ON1}$ and $C_{OFF1}$ are obtained by the following equations:

$$C_{ON1} = C_A$$

$$C_{OFF1} = \frac{C_A \cdot C_B}{C_A + C_B}.$$

Therefore, a unit capacitance $C_{step1}$ is obtained according to a difference between the capacitances $C_{ON1}$ and $C_{OFF1}$, wherein $C_{step1}$ is obtained by the following equation:

$$C_{step1} = C_{ON1} - C_{OFF1} = \frac{C_A^2}{C_A + C_B}.$$

In the embodiment, the unit capacitance $C_{step1}$ is used as a tuning resolution of the frequency tracking unit 60 for turning the output frequency of the signal $S_{out}$ to a target frequency. Furthermore, the capacitors $C_A$ and $C_B$ are passive metal capacitors.

Figure 5:
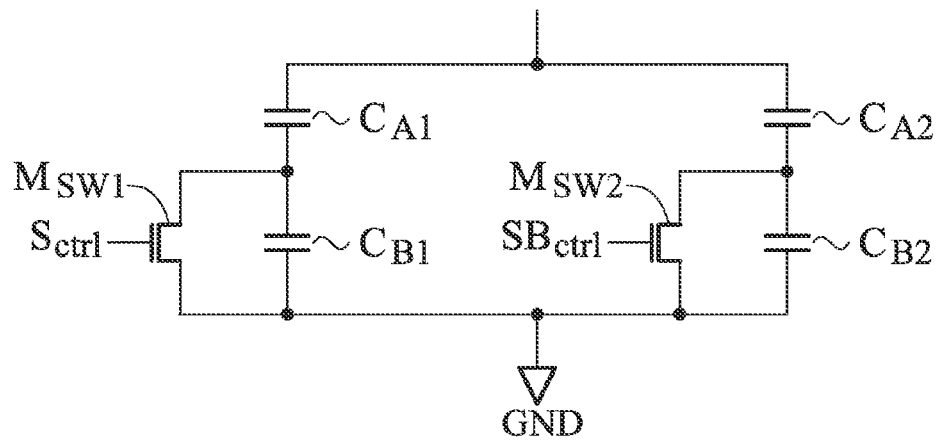
FIG. 5 shows a schematic illustrating the sub-unit of a frequency tracking unit of FIG. 3 according to another embodiment of the invention.

FIG. 5 shows a schematic illustrating the sub-unit 70A/70B of FIG. 3 according to another embodiment of the invention. Referring to FIG. 3 and FIG. 5 together, the capacitors $C_{A1}$ and $C_{A2}$ are coupled to the drain of a corresponding transistor. For example, the capacitors $C_{A1}$ and $C_{A2}$ of the sub-unit 70A are coupled to the drain of the transistor M1, and the capacitors $C_{A1}$ and $C_{A2}$ of the sub-unit 70B are coupled to the drain of the transistor M2. A capacitor $C_{B1}$ is coupled between the capacitor $C_{A1}$ and the ground GND, and a switch $M_{SW1}$ is coupled to the capacitor $C_{B1}$ in parallel, wherein the switch $M_{SW1}$ is controlled by an individual control signal $S_{ctrl}$. A capacitor $C_{B2}$ is coupled between the capacitor $C_{A2}$ and the ground GND, and a switch $M_{SW2}$ is coupled to the capacitor $C_{B2}$ in parallel, wherein the switch $M_{SW2}$ is controlled by a control signal $SB_{ctrl}$ that is complementary to the control signal $S_{ctrl}$. When the switch $M_{SW1}$ is turned on by the control signal $S_{ctrl}$ and the switch $M_{SW2}$ is turned off by the control signal $SB_{ctrl}$, the sub-unit 70A/70B provides an equivalent capacitance $C_{ON2}$ according to the capacitors $C_{A1}$, $C_{A2}$ and $C_{B2}$. When the switch $M_{SW1}$ is turned off by the control signal $S_{cttl}$ and the switch $M_{SW2}$ is turned on by the control signal $SB_{ctrl}$, the sub-unit 70A/70B provides an equivalent capacitance $C_{OFF2}$ according to the capacitors $C_{A1}$, $C_{B1}$ and $C_{A2}$. In the embodiment, the capacitors $C_{A1}$ and $C_{A2}$ have the same capacitance $C_A$, thus the equivalent capacitances $C_{ON2}$ and $C_{OFF2}$ are obtained by the following equations:

$$C_{ON2} = \frac{C_A \cdot C_{B2}}{C_A + C_{B2}} + C_A$$

$$C_{OFF2} = \frac{C_A \cdot C_{B1}}{C_A + C_{B1}} + C_A.$$

Therefore, a unit capacitance $C_{step2}$ is obtained according to a difference between the capacitances $C_{ON2}$ and $C_{OFF2}$, wherein $C_{step2}$ is obtained by the following equation:

$$C_{step2} = C_{ON2} - C_{OFF2} = \frac{C_A^2(C_{B2} - C_{B1})}{(C_A + C_{B1})(C_A + C_{B2})}.$$

In the embodiment, the unit capacitance $C_{step2}$ is used as a tuning resolution of the frequency tracking unit 60 for turning the output frequency of the signal $S_{out}$ to a target frequency. Furthermore, the capacitors $C_{A1}$, $C_{A2}$, $C_{B1}$ and $C_{B2}$ are passive metal capacitors.

Figure 6:
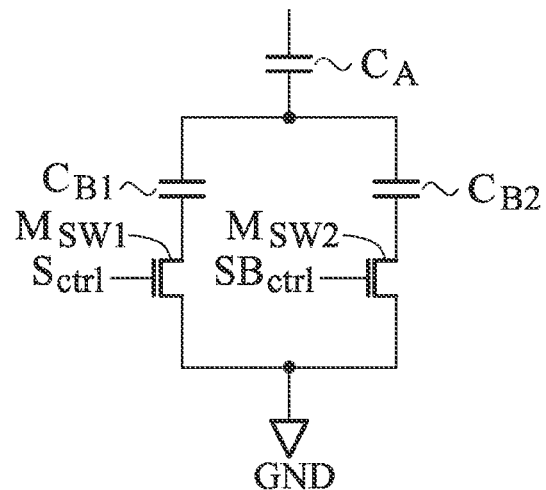
FIG. 6 shows a schematic illustrating the sub-unit frequency tracking unit of FIG. 3 according to another embodiment of the invention.

FIG. 6 shows a schematic illustrating the sub-unit 70A/70B of FIG. 3 according to another embodiment of the invention. Referring to FIG. 3 and FIG. 6 together, the capacitor $C_A$ is coupled to the drain of a corresponding transistor. For example, the capacitors $C_A$ of the sub-unit 70A is coupled to the drain of the transistor M1, and the capacitors $C_A$ of the sub-unit 70B is coupled to the drain of the transistor M2. Two capacitors $C_{B1}$ and $C_{B2}$ are coupled to the capacitor C. A switch $M_{SW1}$ is coupled between the capacitor $C_{B1}$ and the ground GND, wherein the switch $M_{SW1}$ is controlled by an individual control signal $S_{ctrl}$. A switch $M_{SW2}$ is coupled between the capacitor $C_{B2}$ and the ground GND, wherein the switch $M_{SW2}$ is controlled by a control signal $SB_{ctrl}$ complementary to the control signal $S_{ctrl}$. When the switch $M_{SW1}$ is turned on by the control signal $S_{ctrl}$ and the switch $M_{SW2}$ is turned off by the control signal $SB_{ctrl}$, the sub-unit 70A/70B provides an equivalent capacitance $C_{ON3}$ according to the capacitors $C_A$ and $C_{B1}$. When the switch $M_{SW1}$ is turned off by the control signal $S_{ctrl}$ and the switch $M_{SW2}$ is turned on by the control signal $SB_{ctrl}$, the sub-unit 70A/70B provides an equivalent capacitance $C_{OFF3}$ according to the capacitors $C_A$ and $C_{B2}$. The equivalent capacitances $C_{ON3}$ and $C_{OFF3}$ are obtained by the following equations:

$$C_{ON3} = \frac{C_A \cdot C_{B1}}{C_A + C_{B1}}$$

$$C_{OFF3} = \frac{C_A \cdot C_{B2}}{C_A + C_{B2}}.$$

Therefore, a unit capacitance $C_{step3}$ is obtained according to a difference between the capacitances $C_{ON3}$ and $C_{OFF3}$, wherein $C_{step3}$ is obtained by the following equation:

$$C_{step3} = C_{ON3} - C_{OFF3} = \frac{C_A^2(C_{B1} - C_{B2})}{(C_A + C_{B1})(C_A + C_{B2})}.$$

In the embodiment, the unit capacitance $C_{step3}$ is used as a tuning resolution of the frequency tracking unit 60 for turning the output frequency of the signal $S_{out}$ to a target frequency. Furthermore, the capacitors $C_A$, $C_{B1}$ and $C_{B2}$ are passive metal capacitors.

Figure 7:
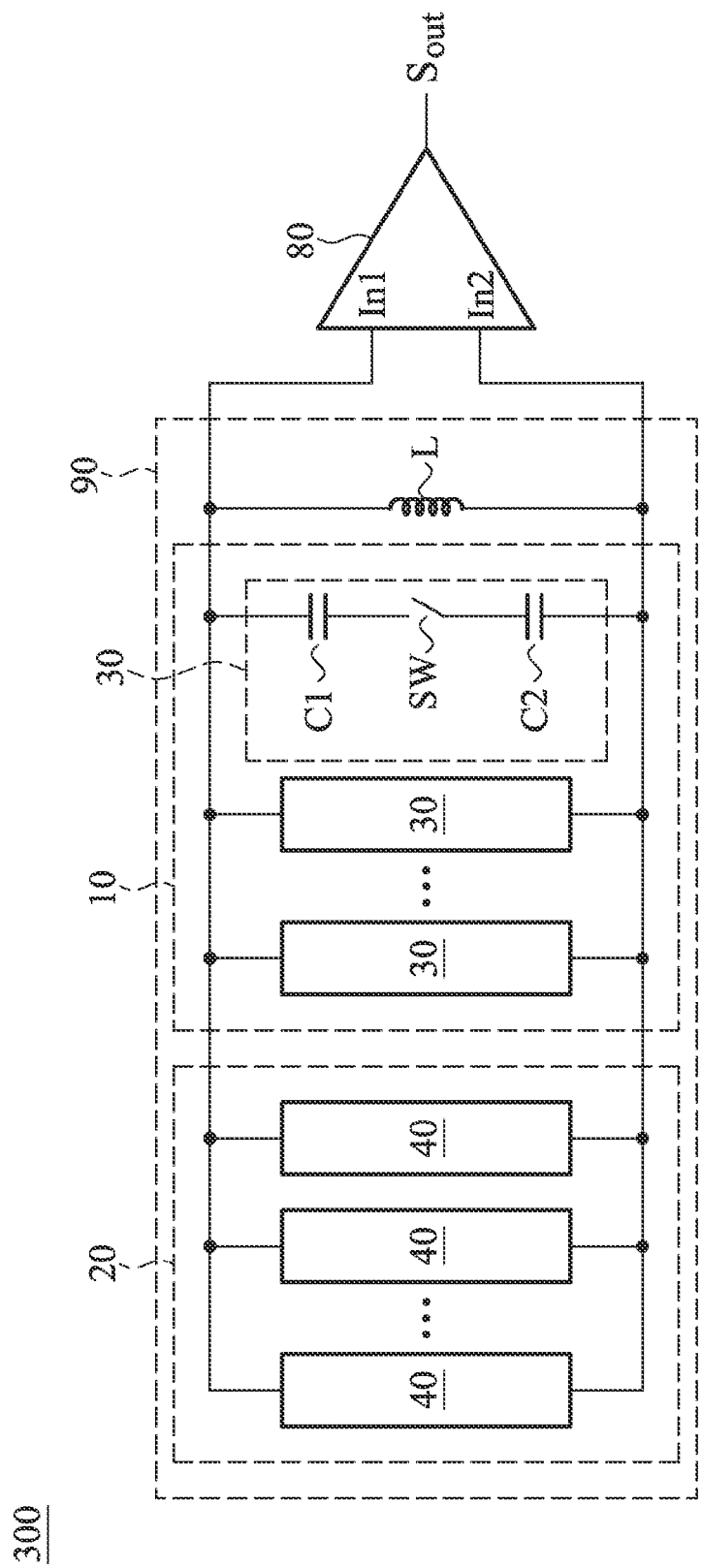
FIG. 7 shows a digitally controlled oscillator according to another embodiment of the invention.

FIG. 7 shows a digitally controlled oscillator 300 according to another embodiment of the invention. The digitally controlled oscillator 300 comprises an amplifier 80 with a negative resistance and an LC circuit 90. The LC circuit 90 comprises an inductor L coupled between the input terminals In1 and In2 of the amplifier 80, a switched capacitor array 10 and a frequency tracking array 20, wherein the switched capacitor array 10 and frequency tracking array 20 are coupled to the inductor L in parallel. In one embodiment, the amplifier 80 comprises a pair of transistors cross-coupled to each other, e.g. the transistors M1 and M2 of FIG. 1 and FIG. 3. As described above, the switched capacitor array 10 comprises a plurality of switched capacitor units 30 coupled in parallel. Each switched capacitor unit 30 comprises a capacitor C1 coupled to the input terminal In1 of the amplifier 80, a capacitor C2 coupled to the input terminal In2 of the amplifier 80 and a switch SW coupled between the capacitors C1 and C2, wherein the switch SW is controlled by an individual control signal. By switching the switches SW of the switched capacitor array 10, an output frequency of a signal $S_{out}$ provided by the amplifier 80 can be tuned coarsely. Furthermore, the frequency tracking array 20 comprises a plurality of frequency tracking units 40 coupled between the input terminals In1 and In2 of the amplifier 80, which is used to finely tune the output frequency of the signal $S_{out}$ to a target frequency. In the frequency tracking array 20, each frequency tracking unit 40 is controlled by an individual control signal that controls the frequency tracking unit 40 to provide a first capacitance (e.g. $C_{ON}$) or a second capacitance (e.g. $C_{OFF}$), so as to obtain a unit capacitance (e.g. $C_{step}$) that is used as a tuning resolution for turning the output frequency of the signal $S_{out}$.

Figure 8:
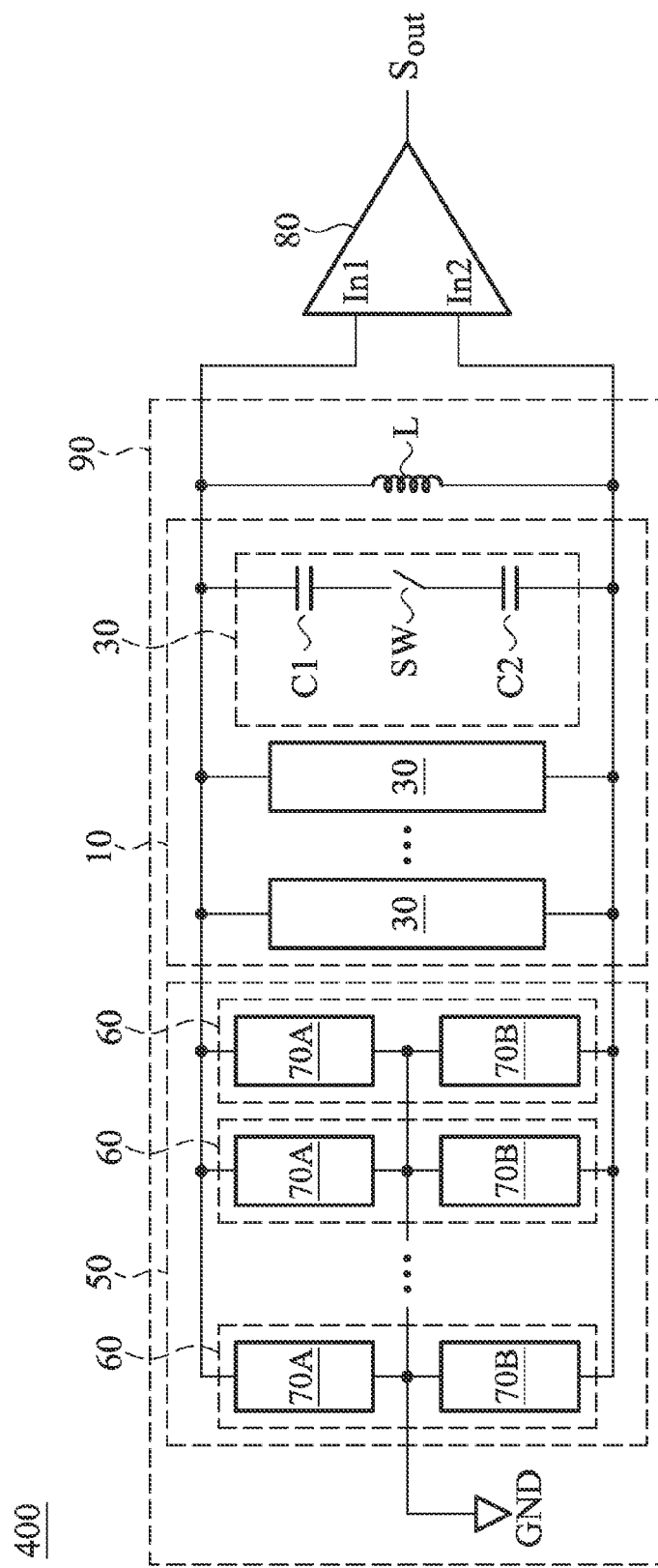
FIG. 8 shows a digitally controlled oscillator according to another embodiment of the invention.

FIG. 8 shows a digitally controlled oscillator 400 according to another embodiment of the invention. In the digitally controlled oscillator 400, a frequency tracking array 50 comprises a plurality of frequency tracking units 60 coupled between the input terminals In1 and In2 of the amplifier 80. As described above, each frequency tracking unit 60 comprises a sub-unit 70A coupled between the input terminal In1 of the amplifier 80 and the ground GND and a sub-unit 70B coupled between the input terminal In2 of the amplifier 80 and the ground GND, wherein the sub-units 70A and 70B have the same circuit structures. Similarly, each frequency tracking unit 60 is controlled by an individual control signal, i.e. the sub-units 70A and 70B of the frequency tracking unit 60 are controlled by the same control signal, wherein the individual control signal controls the sub-units 70A and 70B to provide a first capacitance (e.g. $C_{ON1}$, $C_{ON2}$ and $C_{ON3}$) or a second capacitance (e.g. $C_{OFF1}$, $C_{OFF2}$ and $C_{OFF3}$) simultaneously, so as to obtain a unit capacitance (e.g. $C_{step1}$, $C_{step2}$ and $C_{step3}$) that is used as a tuning resolution for turning the output frequency of the signal $S_{out}$.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A digitally controlled oscillator, comprising:
    a pair of transistors cross-coupled to each other for providing an output signal;
    a switched capacitor array coupled to the pair of transistors, for tuning a frequency of the output signal; and
    a plurality of frequency tracking units coupled to the pair of transistors, for tuning the frequency of the output signal to a target frequency, wherein at least one of the frequency tracking units is capable of selectively providing only one of a first capacitance and a second capacitance, and a tuning resolution of the frequency tracking units is determined by a difference between the first and second capacitances, wherein at least one of the frequency tracking units comprises:
    a first capacitor coupled to one drain of the pair of transistors;
    a second capacitor coupled between the first capacitor and a ground; and
    a first switch coupled to the second capacitor in parallel, wherein the first switch is arranged to have only ON and OFF states;
    wherein the at least one of the frequency tracking units provides only the first capacitance when the first switch is in the ON state and provides the second capacitance when the first switch is in the OFF state.

2. The digitally controlled oscillator as claimed in claim 1, further comprising:
    a first inductor coupled between a common node and the one drain of the pair of transistors; and
    a second inductor coupled between the common node and the other drain of the pair of transistors.

3. The digitally controlled oscillator as claimed in claim 1, wherein the switched capacitor array comprises a plurality of switched capacitor units coupled in parallel, each comprising:
    a third capacitor coupled to the one drain of the pair of transistors;
    a fourth capacitor coupled to the other drain of the pair of transistors; and
    a second switch coupled between the third and fourth capacitors.

4. The digitally controlled oscillator as claimed in claim 1, wherein each of the frequency tracking units comprises a first sub-unit coupled between the one drain of the pair of transistors and the ground, and a second sub-unit coupled between the other drain of the pair of transistors and the ground, wherein at least one of the first and second sub-units comprises the first capacitor and the second capacitor, and the first and second capacitors are metal capacitors.

5. The digitally controlled oscillator as claimed in claim 1, wherein each of the frequency tracking units comprises a first sub-unit coupled between the one drain of the pair of transistors and the ground, and a second sub-unit coupled between the other drain of the pair of transistors and the ground, wherein at least one of the first and second sub-units comprises:
    the first capacitor;
    the second capacitor;
    the first switch;
    a third capacitor coupled to the one drain of the pair of transistors, having a capacitance which is identical to the first capacitor;
    a fourth capacitor coupled between the third capacitor and the ground, having a capacitance which is identical to the second capacitor; and
    a second switch coupled to the fourth capacitor in parallel;
    wherein the first, second, third and fourth capacitors are metal capacitors.

6. The digitally controlled oscillator as claimed in claim 1, wherein the tuning resolutions of the frequency tracking units are identical.

7. A digitally controlled oscillator, comprising:
    an amplifier with a negative resistance, having a first input terminal, a second input terminal and an output terminal for providing an output signal; and
    a LC circuit coupled to the first and second input terminals of the amplifier, comprising:
    a inductor coupled between the first and second input terminals of the amplifier; and
    a plurality of frequency tracking units coupled to the inductor in parallel, wherein at least one of the frequency tracking units is arranged for providing only one of a first capacitance or a second capacitance according to a control signal, so as to finely tune a frequency of the output signal, wherein at least one of the frequency tracking units comprises:
    a first capacitor coupled to a corresponding input terminal of the amplifier;
    a second capacitor coupled between the first capacitor and a ground; and
    a first switch coupled to the second capacitor in parallel, wherein the first switch is arranged to have only ON and OFF states,
    wherein the at least one of the frequency tracking units provides only the first capacitance when the first switch is in the ON state and provides the second capacitance when the first switch is in the OFF state, and
    wherein a tuning resolution of the frequency tracking unit is determined according to a difference between the first and second capacitances.

8. The digitally controlled oscillator as claimed in claim 7, wherein each of the frequency tracking units comprises a first sub-unit coupled between the first input terminal of the amplifier and the ground and a second sub-unit coupled between the second input terminal of the amplifier and the ground, wherein at least one of the first and second sub-units comprises the first capacitor and the second capacitor, wherein the first switch is controlled by the control signal, and the first and second capacitors are metal capacitors.

9. The digitally controlled oscillator as claimed in claim 7, wherein each of the frequency tracking units comprises a first sub-unit coupled between the first input terminal of the amplifier and the ground and a second sub-unit coupled between the second input terminal of the amplifier and the ground, wherein at least one of the first and second sub-units comprises:

the first capacitor;
the second capacitor;
the first switch, wherein the first switch is controlled by the control signal;
a third capacitor coupled to the corresponding input terminal of the amplifier, having a capacitance which is identical to the first capacitor;
a fourth capacitor coupled between the third capacitor and the ground, having a capacitance which is identical to the second capacitor; and
a second switch coupled to the fourth capacitor in parallel, wherein the second switch is controlled by a signal complementary to the control signal;
wherein the first, second, third and fourth capacitors are metal capacitors.

10. The digitally controlled oscillator as claimed in claim 7, wherein the amplifier comprises:

a first transistor having a source coupled to a power, a gate coupled to the second input terminal and a drain coupled to the first input terminal; and
a second transistor having a source coupled to the power, a gate coupled to the first input terminal and a drain coupled to the second input terminal and the output terminal.

11. The digitally controlled oscillator as claimed in claim 7, wherein the LC circuit further comprises:

a switched capacitor array coupled to the inductor in parallel, for coarsely tuning the frequency of the output signal and comprising a plurality of switched capacitor units, wherein each of the switched capacitor units comprises:
a third capacitor coupled to the first input terminal of the amplifier;
a fourth capacitor coupled to the second input terminal of the amplifier; and
a second switch coupled between the third and fourth capacitors.

12. The digitally controlled oscillator as claimed in claim 7, wherein the tuning resolutions of the frequency tracking units are identical.

* * * * *